US011735912B2

(12) United States Patent
Acton et al.

(10) Patent No.: US 11,735,912 B2
(45) Date of Patent: Aug. 22, 2023

(54) SYSTEMS AND METHODS FOR AI-ASSISTED ELECTRICAL POWER GRID FAULT ANALYSIS

(71) Applicant: Qualitrol Company LLC, Fairport, NY (US)

(72) Inventors: Aaron Acton, Pittsburgh, PA (US); Peter Glover, Belfast (GB); Mark Diamond, Bellaghy (GB); Peter Brett, Belfast (GB); David Cole, Ware (GB); Paul Donegan, Dunoon (GB)

(73) Assignee: QUALITROL COMPANY LLC, Fairport, NY (US)

( * ) Notice: Subject to any disclaimer, the term of this patent is extended or adjusted under 35 U.S.C. 154(b) by 0 days.

(21) Appl. No.: 17/875,280

(22) Filed: Jul. 27, 2022

(65) Prior Publication Data
US 2023/0035930 A1 Feb. 2, 2023

Related U.S. Application Data

(60) Provisional application No. 63/226,123, filed on Jul. 27, 2021.

(51) Int. Cl.
*H02J 3/00* (2006.01)
*G05B 23/02* (2006.01)
*G01R 31/08* (2020.01)

(52) U.S. Cl.
CPC ............ *H02J 3/0012* (2020.01); *G01R 31/086* (2013.01); *G01R 31/088* (2013.01); *G05B 23/0245* (2013.01); *G05B 23/0278* (2013.01)

(58) Field of Classification Search
CPC .... H02J 3/0012; G01R 31/086; G01R 31/088; G05B 23/0245; G05B 23/0278; G06Q 10/06; G06Q 10/20; G06Q 50/06; H02J 13/00001; H02J 13/00002; H02J 13/00022; H02J 13/00028; H02J 2203/10; H02J 2203/20; H02J 13/00034
USPC ...................................................... 324/512
See application file for complete search history.

(56) References Cited

U.S. PATENT DOCUMENTS 9,917,436 B2 * 3/2018 Popescu ................ G06Q 50/06

* cited by examiner

*Primary Examiner* — Farhana A Hoque
(74) *Attorney, Agent, or Firm* — SEED IP LAW GROUP, LLP

(57) ABSTRACT

Systems, methods, and processor-readable storage media for AI-assisted electrical power grid fault analysis predict the cause of a fault and cause the fault to be remedied by receiving an indication that a first fault has occurred, identifying a plurality of additional fault records associated with the first fault, obtaining a first prediction of the cause of the fault based on the first fault record and the plurality of fault records by applying the fault records to a machine learning model, obtaining a second prediction of the cause of the fault by applying the fault records to a rules-based model, and obtaining a final prediction of the cause of the first fault based on the first prediction and the second prediction. The final prediction of the cause of the first fault is used to cause the predicted cause of the first fault to be remedied.

21 Claims, 10 Drawing Sheets

SYSTEMS AND METHODS FOR AI-ASSISTED ELECTRICAL POWER GRID FAULT ANALYSIS

CROSS-REFERENCE TO RELATED APPLICATION

This application claims the benefit of U.S. Provisional Pat. Application Ser. No. 63/226,123, filed Jul. 27, 2021, the entirety of which is hereby incorporated by reference. In cases where the present application conflicts with a document incorporated by reference, the present application controls.

BACKGROUND

Technical Field

The present disclosure is directed to fault analysis systems used by electrical power grid operators. These operators typically diagnose the cause of a fault by inspecting fault records generated by equipment or components used in the electrical power grid, such as electrical substations, power lines, intelligent electronic devices, or other electrical power grid components.

Description of the Related Art

Generally, operators of an electrical power grid receive an indication that a fault has occurred from computing systems or devices connected to the electrical power grid components. The operator then manually searches for a fault record created for the fault, and attempts to diagnose the cause of the fault based on information in the fault record. The fault record may additionally be analyzed by a computing system to determine a categorization or classification of the fault record.

Each fault may cause a large number of records to be generated, where only a few of the records are useful in diagnosing the cause of the fault. Thus, even though the fault records are classified, operators must typically still manually identify the cause of the fault by examining information in each of the fault records generated. Repair costs, as well as other costs, to the utility operating the power grid increase with each minute spent analyzing the fault, as further downtime or even damage may occur in the power grid, and other substations or components may be affected by the original "primary" fault. These costs can be exacerbated when an operator misidentifies the cause of the fault by not analyzing the correct fault records.

Furthermore, operators are typically unable to view historical or other data regarding faults in the power grid to aid in their diagnoses of the cause of the fault because the causes of faults must be identified quickly in order to minimize downtime or damage to the power grid. Additionally, because of the time that must be spent in identifying the cause of faults as they occur, operators are unable to predict whether a fault is likely to occur in the future based on the status of equipment which was affected by faults. Operators also typically do not have the time or ability to accurately use other third party data sources to determine the cause of the fault, such as weather data. When operators do have the ability to use such data, they may misidentify the causes of the faults based this data.

BRIEF SUMMARY

The embodiments described herein address the issues above and thus help solve the technical problems and improve the technology for power grid fault analysis by providing a system which automatically identifies the causes of faults which occur in a power grid. Additionally, the embodiments disclosed herein are able to cause faults to be remedied, such as by identifying fault records of interest for analysis by an operator, causing repairs to be initiated for equipment affected by the fault, predicting whether equipment will cause a fault in the future, or other methods of remedying faults in a power grid.

According to at least one embodiment of a power grid fault analysis system, the power grid fault analysis system receives an indication that a first fault has occurred in an electrical power grid. The indication may include a first fault record associated with the first fault. The first fault record may be generated by a first substation of a plurality of substations. The power grid fault analysis system may identify a plurality of additional fault records associated with the first fault. Each fault record in the plurality of fault records may be generated by a substation in the electrical power grid other than the first substation. The power grid fault analysis system may obtain a first prediction of the cause of the first fault by applying the first fault record and the plurality of additional fault records to a trained machine learning model that has been trained to predict the cause of a fault based on historical fault records. The power grid fault analysis system may obtain a second prediction of the cause of the first fault by applying the first fault record to a rules-based model. The power grid fault analysis system may obtain a final prediction of the cause of the first fault based on the first prediction and the second prediction. The power grid fault analysis system may cause the predicted cause of the fault to be remedied based on the final prediction of the cause of the first fault.

In some embodiments, the power grid fault analysis system identifies one or more fault records of interest included in a plurality of fault records based on the final prediction and the first fault record. The power grid fault analysis system may cause an operator computing device to present the one or more fault records of interest to an operator.

In some embodiments, the power grid fault analysis system generates a map of one or more substations associated with the fault records of interest. The power grid fault analysis system may cause an operator computing device to display the map to the operator.

In some embodiments, the power grid fault analysis system identifies equipment in the substation associated with the first fault which are related to the final prediction of the cause of the first fault. The power grid fault analysis system may identify which pieces of equipment require repair based on at least the first fault record and the final prediction of the cause of the first fault. The power grid fault analysis system may cause the equipment which require repair to be repaired.

In some embodiments, for each fault record of a plurality of fault records, the power grid fault analysis system identifies a category of a fault associated with each fault record by applying the fault record to a second rules-based model which is configured to identify a category for a fault based on a fault record.

In some embodiments, the power grid fault analysis system determines whether the first prediction of the cause of the first fault and the second prediction of the cause of the first fault are the same. When the power grid fault analysis system determines that the first prediction and the second prediction are not the same, the power grid fault analysis system may determine which prediction of the cause of the fault is more accurate. The power grid fault analysis system may identify the final prediction of the cause of the first fault based on the determination of which prediction is more accurate.

In some embodiments, the power grid fault analysis system compares a confidence level included in the first prediction to a confidence level included in the second prediction. The power grid fault analysis system may determine which prediction is more accurate based on the comparison of the confidence levels.

In some embodiments, the power grid fault analysis system receives accuracy data indicating an accuracy of the machine learning model and accuracy data indicating an accuracy of the rules-based model. The power grid fault analysis system may determine which prediction of the cause of the fault is more accurate based on the accuracy data for the machine learning model and the accuracy data for the rules-based model.

In some embodiments, the power grid fault analysis system receives an indication of additional data associated with the first fault from a source other than the substations included in the electrical power grid. The power grid fault analysis system may obtain the final prediction of the cause of the fault based on the first prediction, the second prediction, and the additional data. The additional data may include one or more of: weather data, equipment data for equipment used in the electrical power grid, and power usage statistics for a population which receives power from the electrical grid.

In some embodiments, the power grid fault analysis system receives an indication of a plurality of historical fault records in an electrical power grid. The historical fault records may include a category of a fault and a cause of the fault. The power grid fault analysis system may train the machine learning model to predict the cause of the fault based on the historical fault records.

DETAILED DESCRIPTION

Figure 1:
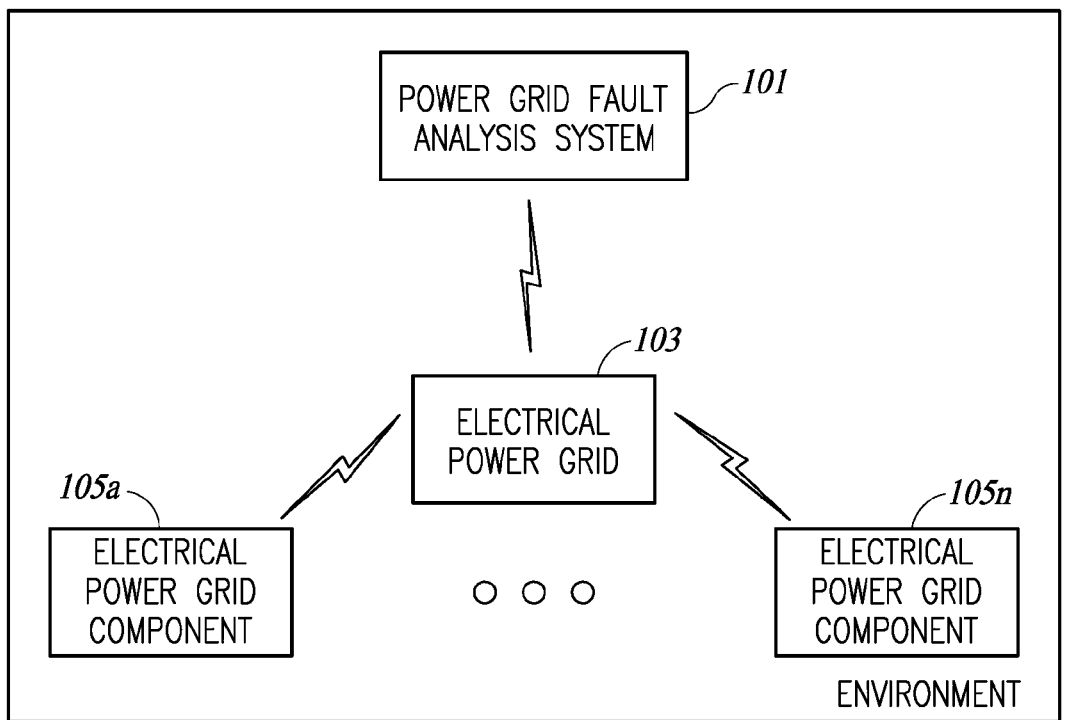
FIG. 1 illustrates an example environment in which a power grid fault analysis system may operate, according to various embodiments described herein.

The present disclosure is directed to a power grid fault analysis system for identifying faults and the causes of the faults which occur in an electrical power grid and causing the identified faults to be remedied. The power grid fault analysis system may additionally use a map of the electrical power grid to identify primary faults, secondary faults, causes of faults, etc. Furthermore, the power grid fault analysis system may obtain multiple predictions of the cause of a fault, such as a prediction from a machine learning model and a prediction from a rules-based model, which are combined to generate a final prediction of the cause of the fault.

Unless the context requires otherwise, throughout the specification and claims which follow, the word "comprise" and variations thereof, such as, "comprises" and "comprising" are to be construed in an open, inclusive sense, for example "including, but not limited to."

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. The term "or" is generally employed in its sense including "and/or" unless the content clearly dictates otherwise.

The headings and Abstract of the Disclosure provided herein are for convenience only and do not interpret the scope or meaning of the embodiments.

Implementations of the present disclosure are directed to computer-implemented systems and methods for fault analysis in electrical power grids, including identifying and remedying the causes of such faults. Thus, the aforementioned inefficient and unreliable processes in conventional systems are improved to provide remedies to the causes of faults that were previously not possible using conventional workflows. Additionally, by predicting the cause of a fault and remedying the cause, the electrical power grid has less downtime and is able to resume normal operation much quicker than by using conventional methods.

In the present disclosure, different types of faults, such as a "primary fault" and a "secondary fault" may be described. A primary fault may be a fault which occurs on the power grid, and is typically the first fault in a series of faults. A secondary fault may be a fault which is caused, assumed to be caused, etc., by a primary fault. Aspects of the primary fault may be used to determine whether a fault is a secondary fault, or a separate fault unrelated to the primary fault. In some embodiments, the layout, organization, or other aspects of the power grid, or the components within the power grid, are used to determine whether a fault is a secondary fault or whether the fault is unrelated to the primary fault.

Such implementations are thus able to improve the functioning of computer or other hardware, such as by reducing the dynamic display area, processing, storage, and/or data transmission resources needed to perform a certain task, thereby enabling the task to be performed by less capable, and/or expensive hardware devices, and/or be performed with lesser latency, and/or preserving more valuable resources for use in performing other tasks. For example, by predicting the cause of a fault and identifying relevant fault records, the power grid fault analysis system is able to reduce the amount of computing resources used by operators to search for and evaluate relevant fault records. Additionally, by generating a map of faults based on the predicted cause of the fault and relevant fault records, an operator is able to more quickly identify a remedy for the fault. Likewise, such implementations improve the operation of the electrical power grid as a whole, by improving the ability of operators to quickly and correctly implement remedies for faults which have occurred in the electrical power grid.

Furthermore, such implementations are able to more quickly arrive at a determination of a root cause of a fault, including a power grid disturbance, than current computing or manual methods of making this determination. Therefore, such implementations of the present disclosure are able to minimize the downtime of the power grid due to the fault, such as by allowing operators to react much faster to repair the fault than conventional methods of determining fault causes.

FIG. 1 illustrates an example environment 100 in which a power grid fault analysis system 101 may operate, according to various embodiments described herein. It is to be appreciated that FIG. 1 illustrates just one example of an environment 100 and that the various embodiments discussed herein are not limited to the use of such an environment. The environment 100 includes a power grid fault analysis system 101, an electrical power grid 103, and electrical power grid components 105a-105n.

The power grid fault analysis system 101 may communicate with the power grid, such as the power grid 103, through one or more computing devices, servers, etc., associated with the power grid. The power grid fault analysis system 101 may communicate with a power grid to: receive fault records, such as historical fault records, primary fault records, secondary fault records, or other fault records. The power grid fault analysis system 101 may communicate with a power grid to provide a prediction of a cause of a fault. The power grid fault analysis system 101 may communicate with the power grid via one or more computing devices, servers, etc., associated with the power grid, to cause a predicted cause of a fault to be remedied. The power grid fault analysis system is further described below with respect to FIG. 2.

The electrical power grid 103 is an electrical power grid which is able to generate, transmit, and/or distribute power to a region. It is to be appreciated that although FIG. 1 illustrates the use of the power grid fault analysis system in connection with the electrical power grid as a whole, the power grid fault analysis system may be used in connection with one or more of the power generation, power transmission, or power distribution aspects of the electrical power grid, without being applied to the power grid as a whole. Furthermore, although FIG. 1 illustrates the power grid fault analysis system 101 as separate from the electrical power grid 103, the power grid fault analysis system 101 may be included in the electrical power grid 103, such as being included in, installed on, accessible by, etc., one or more computer systems associated with the electrical power grid 103.

The electrical power grid 103 includes one or more electrical power grid components 105a-105n (collectively electrical power grid components 105). The electrical power grid components 105 may include: substations; power lines; equipment used in the power grid; intelligent electronic devices; electrical devices such as a transformer, a generator, an electrical connection, an electrical engine, or other type of electrical device or power driven device; or other components, equipment, or utility assets used in an electrical power grid. Each of the electrical power grid components 105 may communicate their current status, the status of other electrical power grid components 105, or other data related to an electrical power grid component to the electrical power grid 103. For example, an electrical power grid component may generate a fault record, and may transmit that fault record to a computing system included in the electrical power grid 103 used for monitoring and maintaining electrical power grid components.

The power grid fault analysis system 101, electrical power grid 103, and electrical power grid components 105 included in the environment 100 may communicate via a network. Non-limiting examples of such a network include, but are not limited to, an Ethernet system, twisted pair Ethernet system, an intranet, a local area network (LAN) system, short range wireless network (e.g., Bluetooth®), a personal area network (e.g., a Zigbee network based on the IEEE 802.15.4 specification), a Consumer Electronics Control (CEC) communication system, Wi-Fi, satellite communication systems and networks, cellular networks, cable networks, 4G/5G/6G network, or the like. The power grid fault analysis system 101, electrical power grid 103, one or more electrical power grid components 105, and one or more operator user devices, such as PCs, tablets, laptop computers, smartphones, personal assistants, Internet connection devices, wireless LAN, WiFi, Worldwide Interoperability for Microwave Access (WiMax) devices, or the like, may be communicatively coupled to the network and/or to each other so that they may communicate via the network. Thus, such a network enables power grid fault analysis system 101 to transmit or receive data from the electrical power grid 103 and the electrical power grid 103 to transmit or receive data from the electrical power grid components 105.

The above description of the environment 100, and the various networks, power grids, systems, components, and functions therein, is intended as a broad, non-limiting overview of an example environment in which various embodiments of a power grid fault analysis system can operate. The environment 100, and the various devices, power grids, systems, and components therein, may contain other devices, systems and/or media not specifically described herein. The environment 100, and the various functions therein, may contain other functions, systems and/or media not specifically described herein.

Figure 2:
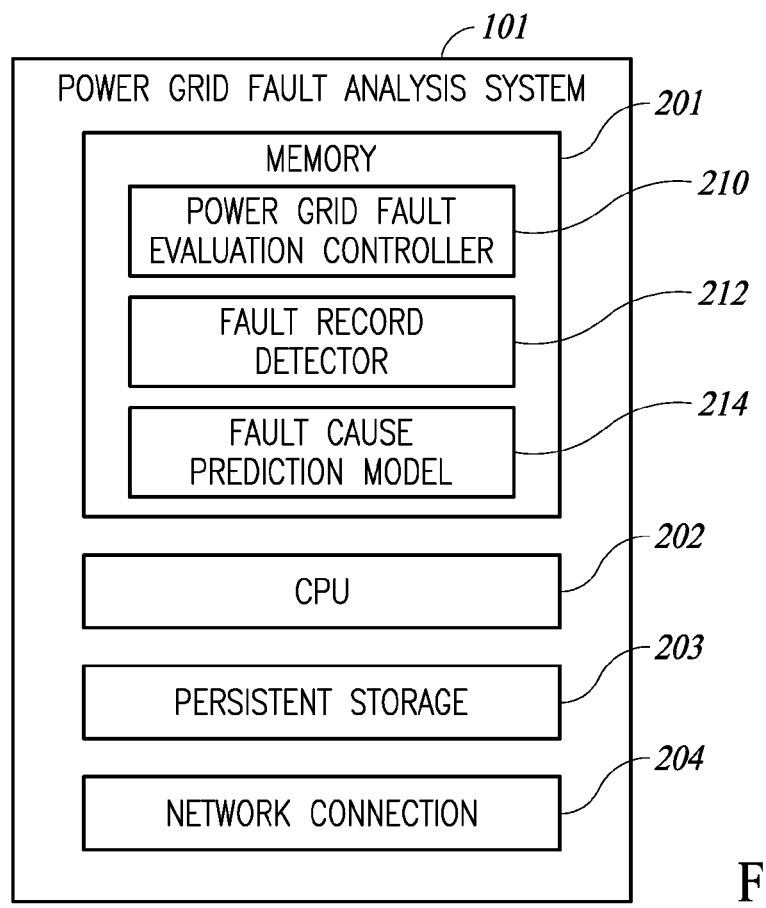
FIG. 2 is a block diagram of a power grid fault analysis system, according to various embodiments described herein.

FIG. 2 is a block diagram of a power grid fault analysis system 101, according to various embodiments described herein. In various embodiments, the power grid fault analysis system 101 includes one or more of the following: a computer memory 201 for storing programs and data, including data associated with the electrical power grid 103, electrical power grid components 105a-105n, fault records, an operating system including a kernel, and device drivers; a central processing unit (CPU) 202 for executing computer programs; a persistent storage device 203, such as a hard drive or flash drive for persistently storing programs and data; and a network connection 204 for communicatively connecting to one or more computer devices, functions or components of the electrical power grid 103, electrical power grid components 105, operator computing devices, other systems associated with an electrical power grid, and/or other computer systems, to send and/or receive data, such as via the Internet or another network and associated networking hardware, such as switches, routers, repeaters, electrical cables and optical fibers, light emitters and receivers, radio transmitters and receivers, and the like. In various embodiments, the power grid fault analysis system 101 additionally includes user input and output devices, such as a keyboard, a mouse, display devices, etc.

The memory 201 may include a power grid fault evaluation controller 210, a fault record detector 212, and a fault cause prediction model 214. The power grid fault evaluation controller 210 performs the core functions of the power grid fault analysis system 101, and may use the fault record detector 212 and fault cause prediction model 214 to perform aspects of the core functions of the power grid fault analysis system 101, such as the aspects described below with respect to FIGS. 3a-14.

The fault record detector 212 may be used by the power grid fault evaluation controller 210 to detect one or more faults, such as one or more primary faults, one or more secondary faults, or other faults. The fault detector 212 may additionally include a rules-based engine for categorizing faults. Examples of such categories are further described below with respect to FIG. 3a.

The fault cause prediction model 214 may be used by the power grid fault evaluation controller 210 to generate a prediction of the cause of a fault. In some embodiments, the fault cause prediction model 214 includes an AI or machine learning model trained to predict the cause of a primary fault based on at least one or more fault records related to one or more of the primary fault and one or more secondary faults. In some embodiments, the fault cause prediction model 214 includes a rules-based algorithm configured to predict the cause of a primary fault based on one or more fault records related to the primary fault. The fault cause prediction model 214 may use both a rules-based algorithm and a machine learning model to generate a prediction of the cause of the fault. In some embodiments, the fault cause prediction model 214 is used to generate a prediction of the cause of a primary fault.

In particular, the power grid fault evaluation controller 210 may receive a fault record describing a primary fault, and causes a prediction of the cause of the fault to be generated. Additionally, the power grid fault evaluation controller 210 may identify secondary faults related to the primary fault. Furthermore, the power grid fault evaluation controller 210 may identify fault records of interest based on the predicted cause of the primary fault. The power grid fault evaluation controller 210 may additionally generate a map of the fault records of interest, and cause the generated map to be presented to an operator, such as by transmitting the generated map to an operator computing device. In some embodiments, the power grid fault evaluation controller 210 determines whether equipment included in one or more electrical power grid components, such as the electrical power grid components 105, require repair based on at least the primary fault record.

In an example embodiment, the power grid fault evaluation controller 210 and/or computer-executable instructions stored on memory 201 of the power grid fault analysis system 101 are implemented using standard programming techniques. For example, the power grid fault evaluation controller 210 and/or computer-executable instructions stored on memory 201 of the power grid fault analysis system 101 may be implemented as a "native" executable running on CPU 202, along with one or more static or dynamic libraries. In other embodiments, the power grid fault evaluation controller 210 and/or computer-executable instructions stored on memory 201 of the power grid fault analysis system 101 may be implemented as instructions processed by a virtual machine that executes as some other program.

The embodiments described above may also use synchronous or asynchronous client-server computing techniques. However, the various components may be implemented using more monolithic programming techniques as well, for example, as an executable running on a single CPU computer system, or alternatively decomposed using a variety of structuring techniques known in the art, including but not limited to, multiprogramming, multithreading, client-server, or peer-to-peer, running on one or more computer systems each having one or more CPUs. Some embodiments may execute concurrently and asynchronously, and communicate using message passing techniques. Equivalent synchronous embodiments are also supported. Also, other functions could be implemented and/or performed by each component/module, and in different orders, and by different components/modules, yet still achieve the functions of the power grid fault analysis system 101.

In addition, programming interfaces to the data stored as part of the power grid fault evaluation controller 210 can be available by standard mechanisms such as through C, C++, C#, Java, and Web APIs; libraries for accessing files, databases, or other data repositories; through scripting languages such as JavaScript and VBScript; or through Web servers, FTP servers, or other types of servers providing access to stored data. The power grid fault evaluation controller 210 may be implemented by using one or more database systems, file systems, or any other technique for storing such information, or any combination of the above, including implementations using distributed computing techniques.

Different configurations and locations of programs and data are contemplated for use with techniques described herein. A variety of distributed computing techniques are appropriate for implementing the components of the embodiments in a distributed manner including but not limited to TCP/IP sockets, RPC, RMI, HTTP, Web Services (XML-RPC, JAX-RPC, SOAP, and the like). Other variations are possible. Also, other functionality could be provided by each component/module, or existing functionality could be distributed amongst the components/modules in different ways, yet still achieve the functions of the power grid fault analysis system 101, electrical power grid 103, and electrical power grid components 105.

Furthermore, in some embodiments, some or all of the components or portions of the power grid fault evaluation controller 210, and/or functionality provided by the computer-executable instructions stored on memory 201 of the power grid fault analysis system 101 may be implemented or provided in other manners, such as at least partially in firmware and/or hardware, including, but not limited to, one or more application-specific integrated circuits (ASICs), standard integrated circuits, controllers (e.g., by executing appropriate instructions, and including microcontrollers and/or embedded controllers), field-programmable gate arrays (FPGAs), complex programmable logic devices (CPLDs), and the like. Some or all of the system components and/or data structures may also be stored as contents (e.g., as executable or other machine-readable software instructions or structured data) on a computer-readable medium (e.g., as a hard disk; a memory; a computer network or cellular wireless network; or a portable media article to be read by an appropriate drive or via an appropriate connection, such as a DVD or flash memory device) so as to enable or configure the computer-readable medium and/or one or more associated computing systems or devices to execute or otherwise use or provide the contents to perform at least some of the described techniques. Such computer program products may also take other forms in other embodiments. Accordingly, embodiments of this disclosure may be practiced with other computer system configurations.

In general, a range of programming languages may be employed for implementing any of the functionality of the servers, functions, electrical power grid, electrical power grid components, etc., present in the example embodiments, including representative implementations of various programming language paradigms and platforms, including but not limited to, object-oriented (e.g., Java, C++, C#, Visual Basic.NET, Smalltalk, and the like), functional (e.g., ML, Lisp, Scheme, and the like), procedural (e.g., C, Pascal, Ada, Modula, and the like), scripting (e.g., Perl, Ruby, PHP, Python, JavaScript, VBScript, and the like) and declarative (e.g., SQL, Prolog, and the like).

Figure 3A:
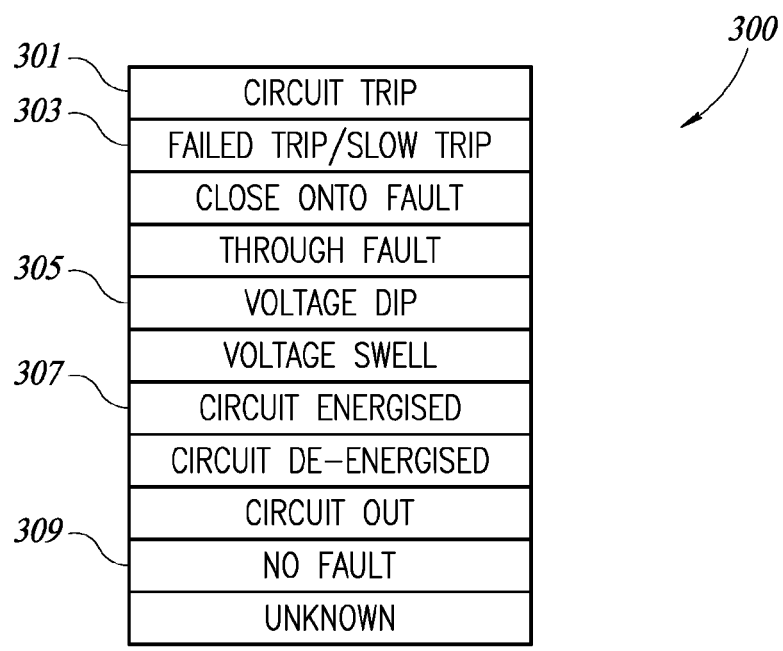
FIG. 3a is a sample fault category table depicting multiple fault categories used to classify faults, according to various embodiments described herein.

FIG. 3a is a sample fault category table 300 depicting multiple fault categories used to classify faults, according to various embodiments described herein. While the fault category table 300 includes a variety of fault categories, other fault categories may be included in the fault category table 300, and may be used by a power grid fault analysis system, such as the power grid fault analysis system 101. Furthermore, additional fault categories may be added to the fault category table 300 by the power grid fault analysis system. Examples of different fault categories included in the fault category table 300 include, but are not limited to, a circuit trip 301, a failed trip/slow trip 303, a voltage dip 305, circuit energized 307, and no fault 309. In some embodiments, the fault record categorizations are based on the patterns and changes of magnitude of at least one of the current sinusoidal waveforms of a three-phase circuit and the voltage sinusoidal waveforms of a three-phase circuit. Furthermore, in some embodiments, at least one of an AI or machine learning model trained to determine the category of a fault and a rules-based model configured to determine a category of the fault are used to determine the fault category.

In the sample fault category table 300, a circuit trip 301 is a category of fault which indicates that the circuit is off supply. A failed trip 303 category indicates that a fault has occurred, but the circuit may or may not have switched off as it was supposed to. A voltage dip 305 category indicates that voltage has dropped below a predetermined voltage level of the circuit. A circuit energized 307 category indicates that a circuit with no voltage was switched on. A no fault 309 category indicates that no fault occurred.

Figure 3B:
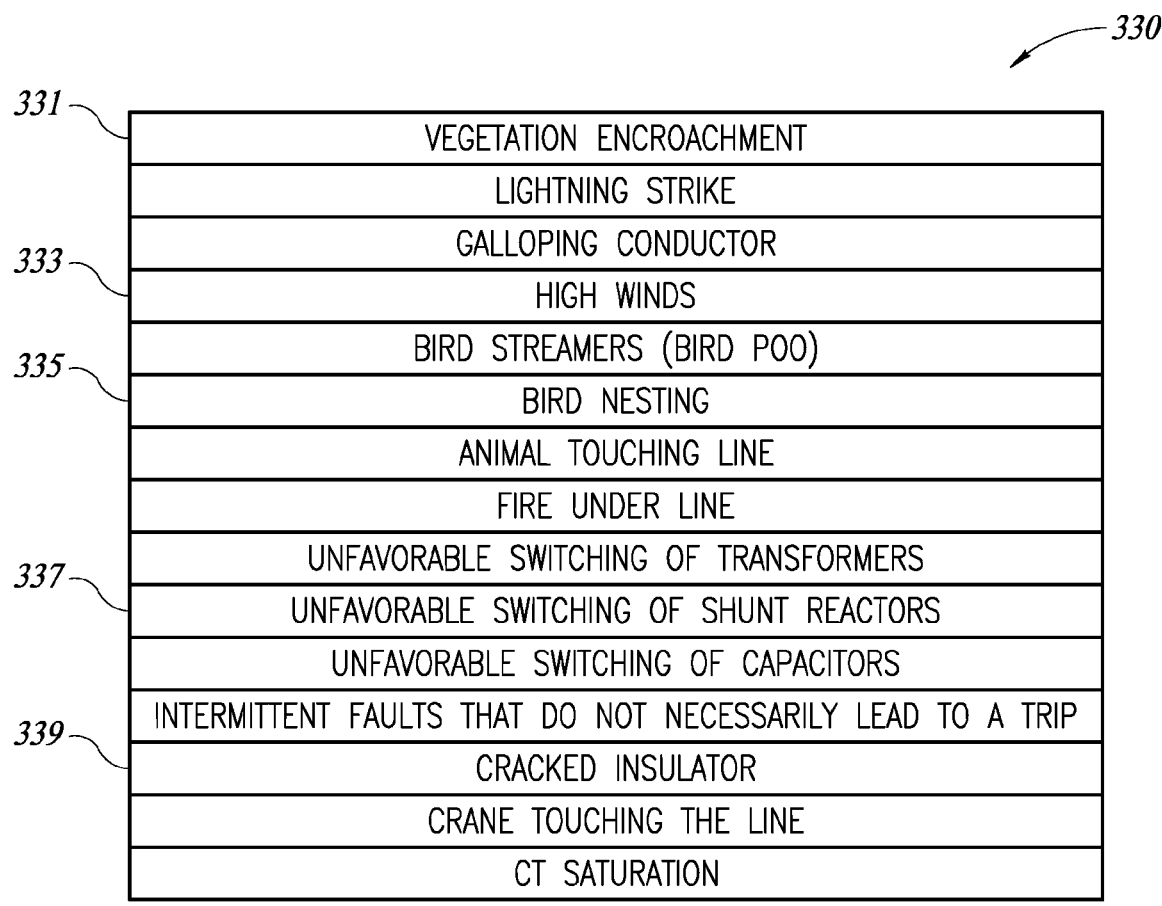
FIG. 3b is a sample fault cause table depicting potential causes of a fault, according to various embodiments described herein.

FIG. 3b is a sample fault cause table 330 depicting potential causes of a fault, according to various embodiments described herein. While the fault cause table 330 includes a variety of fault causes, other fault causes may be included in the fault cause table 330. Furthermore, additional fault causes may be added to the fault cause table 330 by a power grid fault analysis system. In some embodiments, once a cause of a fault which is not included in the fault cause table 330 is identified by one or more operators a predetermined number of times, the power grid fault analysis system may add the cause of the fault to the fault cause table 330. In some embodiments, at least a portion of the fault causes have a distinct pattern in the relation of the voltage and current, as well as phase angle differences between voltage and current.

The sample fault cause table 330 includes a vegetation encroachment cause 331, a high winds cause 333, a bird nesting cause 335, an unfavorable switching of shunt reactors cause 337, and a cracked insulator cause 339. The vegetation encroachment cause 331 indicates that vegetation, such as plants, trees, etc., have caused a fault by encroaching on an aspect of at least one electrical power grid component, such as an electrical power grid component 105. The high winds cause 333 indicates that high winds have caused a fault by interfering with, damaging, etc., an aspect of at least one electrical power grid component. The bird nesting cause 335 indicates that a fault was caused by one or more birds which have nested near at least one electrical power grid component. The unfavorable switching of shunt reactors cause 337 indicates that the fault was caused by a circuit switch which occurred under unfavorable conditions. The cracked insulator cause 339 indicates that the fault was caused by one or more cracks in an insulator associated with at least one electrical power grid component.

Figure 3C:
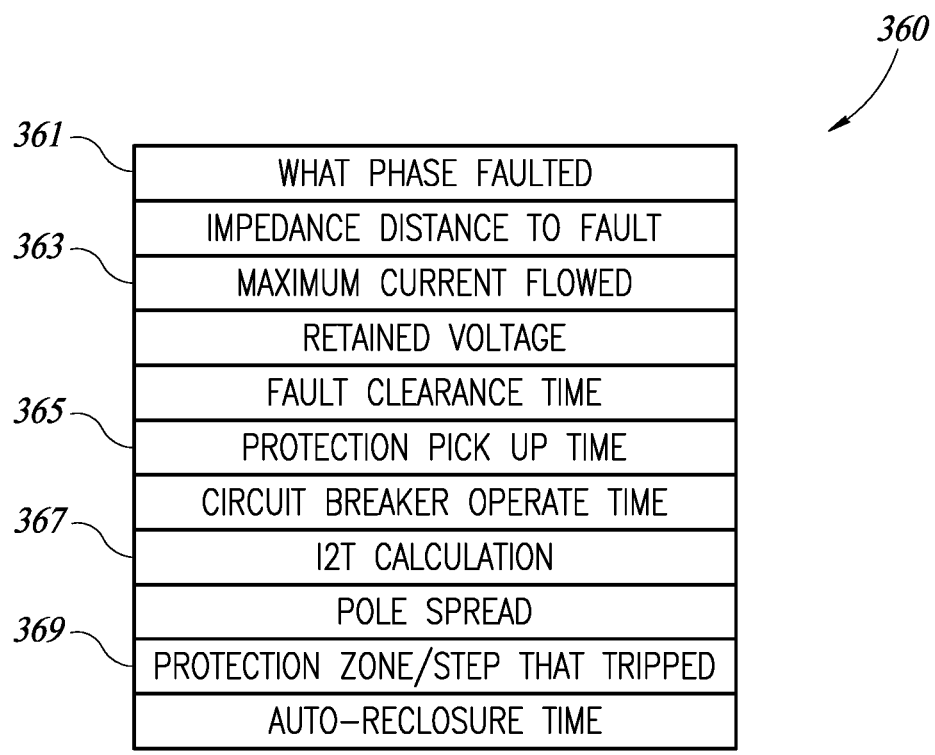
FIG. 3c is a sample fault parameter table depicting various fault parameters which may be generated by a power grid fault analysis system, according to various embodiments described herein.

FIG. 3c is a sample fault parameter table 360 depicting various fault parameters which may be generated by a power grid fault analysis system, according to various embodiments described herein. While the fault parameter table 360 includes a variety of fault parameters, other fault parameters may be included in the fault parameter table 360. Furthermore, additional fault parameters may be added to the fault parameter table 360 by the power grid fault analysis system. In some embodiments, the power grid fault analysis system calculates such parameters by using a fault cause prediction model, such as the fault cause prediction model 214, a rules-based algorithm configured to calculate such parameters, an AI or machine learning model configured to generate such parameters, or perform other methods of analyzing a fault record to generate such parameters.

In some embodiments, the parameters are derived from a combination of analogue and digital inputs contained within a fault record. For example, fault inception may be determined by a sudden change in magnitude of a phase current and/or a sudden change in magnitude of a phase voltage. The time of fault inception may be used as a reference point to measure the period for relay, protection signaling and breaker operations. Analysis of changes in magnitude of the phase currents and voltages may determine what phases are involved in the fault. An auto-reclose time period may be from when the circuit is initially tripped to when it is energized again. It also may be likely that the re-close operation may be on a different fault record.

Furthermore, processing of the parameters may determine if the power grid reacted correctly to the disturbance. Pre-configured rules may be actioned to detect if the relay, protection signaling or breaker operations were outside programmed limits. Abnormal operations may be flagged in a report, a list view, a map, etc.

Additionally, a "through Fault" Activity log may be generated by the power grid fault cause analysis system to contribute to a transformer asset health index assessment. The magnitude of the "through fault" event may be the max half cycle value of the current that the LV side of a transformer contributes to a fault.

The fault parameters included in the sample fault parameter table 360 include, but are not limited to, the phase that faulted 361, the maximum current flowed 363, the protection pick-up time 365, an I2T calculation 367, and a protection zone that tripped 369. The phase that faulted 361 indicates one or more phases of a multi-phase power system associated with a fault. The maximum current flowed 363 indicates the maximum current that flowed on any of the faulted phases during a fault event. The protection pick-up time 365 indicates the amount of time from fault inception to when the relay starting element is engaged. The I2T calculation 367 indicates a measure of the accumulated energy dissipated in a circuit breaker contact set when a fault current is interrupted. The protection zone that tripped 369 indicates the protection relay element that issued a trip command to operate a circuit breaker. For example, fault inception may be determined by a sudden change in magnitude of a phase current, a sudden change in magnitude of a phase voltage, etc. The time of a fault inception may be used as a reference point to measure a period for relay, protection signaling, and breaker operations. Analysis of the change in magnitude of phase currents and voltages may be used to determine which phases are involved in the fault. Analysis of the change in magnitude of phase currents and voltages may also be used to determine when the auto-reclose time period occurs after the fault occurs. The processed parameters may be used by a power grid fault analysis system to determine if the power grid reacted correctly to the disturbance indicated by the primary fault record. Pre-configured rules, such as in the rules-based algorithm, learned by the AI or machine learning model, etc., may be used to detect if the relay, protection signaling, or breaker operations were outside programmed limits. Abnormal operations identified by the power grid fault analysis system may be indicated to an operator.

The fault parameters included in the sample fault parameter table 360 include, but are not limited to, the phase that faulted 361, the maximum current flowed 363, the protection pick-up time 365, an I2T calculation 367, an a protection zone that tripped 369.

Figure 4:
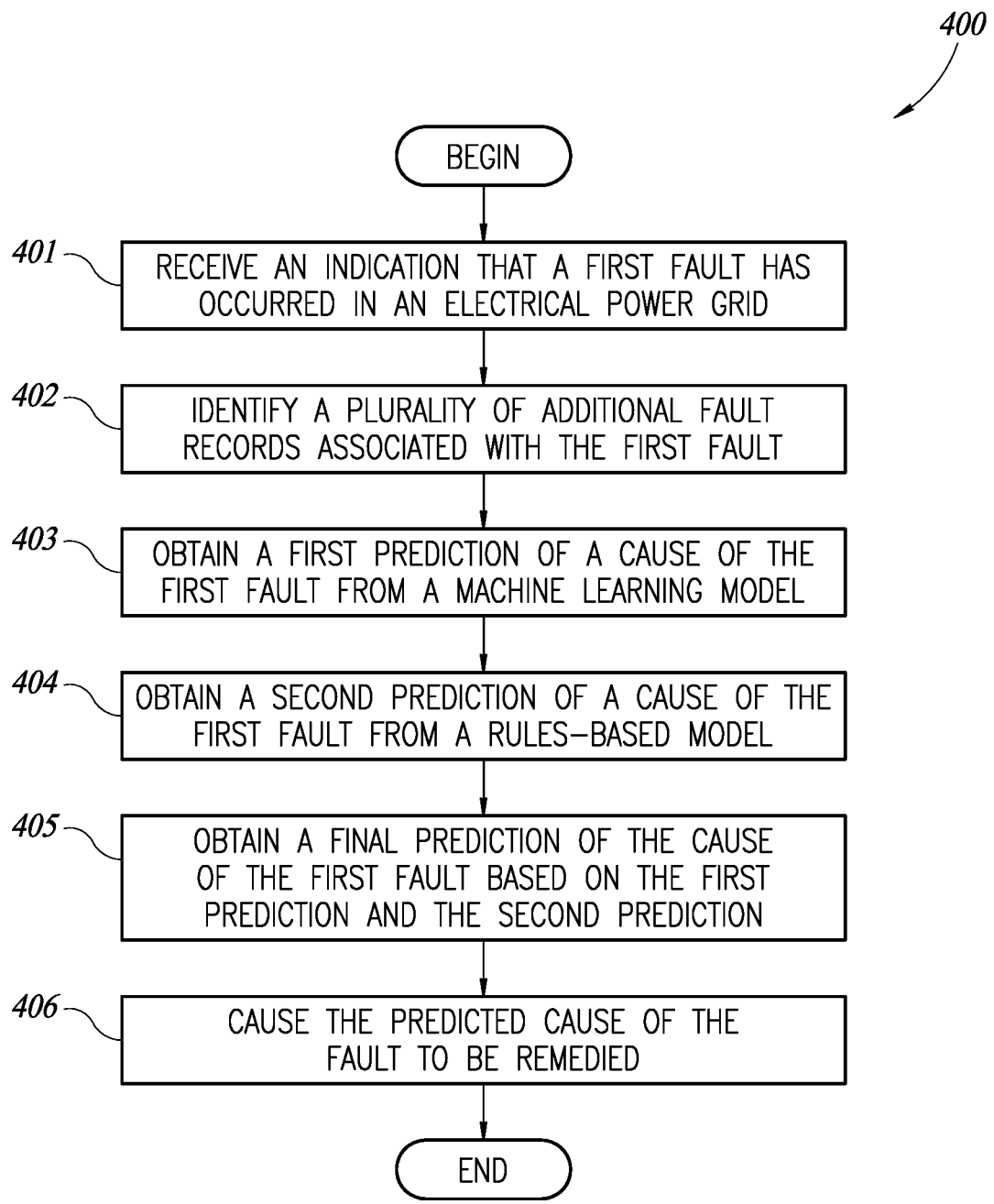
FIG. 4 is a flow diagram depicting a process used by a power grid fault analysis system to generate a prediction of a cause of a fault, according to various embodiments described herein.

FIG. 4 is a flow diagram depicting a process 400 used by a power grid fault analysis system to generate a prediction of a cause of a fault, according to various embodiments described herein. The process 400 begins, after a start block, at act 401, where the power grid fault analysis system receives an indication that a first fault has occurred in an electrical power grid. In some embodiments, the indication includes a first fault record associated with the first fault. The first fault record may be generated by a first substation of a plurality of substations included in the electrical power grid.

The process 400 continues to act 402, where the power grid fault analysis system identifies a plurality of additional fault records associated with the first fault. In some embodiments, each fault record of the plurality of fault additional fault records may be generated by a respective substation in the electrical power grid other than the first substation. In some embodiments, the power grid fault analysis system identifies the additional fault records by using the process described below with respect to FIG. 5.

The process 400 continues to act 403, where the power grid fault analysis system obtains a first prediction of a cause of the first fault from a machine learning model trained to generate a prediction of the cause of a fault based on one or more fault records. In some embodiments, the first prediction is obtained by applying a primary fault record and one or more secondary fault records to the machine learning model, where the primary fault record is the first fault record and the secondary fault records are the additional fault records.

The process 400 continues to act 404, where the power grid fault analysis system obtains a second prediction of the cause of the first fault from a rules-based model. In some embodiments, the power grid fault analysis system obtains the second prediction by applying one or more of the first fault record and the additional fault records to the rules-based model.

The process 400 continues to act 405, where the power grid fault analysis system obtains a final prediction of the cause of the first fault based on the first prediction and the second prediction. In some embodiments, the power grid fault analysis system obtains the final prediction by using one or more of the processes described below in connection with FIGS. 9, 10, 11, and 12.

The process 400 continues to act 406, where the power grid fault analysis system causes the predicted cause of the fault to be remedied. In some embodiments, the power grid fault analysis system causes the predicted cause of the fault to be remedied by using one or more of the processes described below in connection with FIGS. 6, 7, or 8.

After act 406, the process 400 ends. In some embodiments, in the process 400, signals, such as voltage signals, current signals, etc., are preprocessed using at least one of statistical methods and principal component analysis in order to reduce the times the power grid fault analysis system searches for faults into a smaller set of characteristic features. Such features may also be used to train a machine learning model in order to map the features into fault categories. Furthermore, predictions for new signals not used for training can be obtained to predict a likely fault category for a fault. In some embodiments, predictions with a low confidence level may be re-labelled into an unknown category and are manually recategorized and fed back into the machine learning model training to improve the accuracy of the machine learning model over time.

In some embodiments, before act 403, the power grid fault analysis system determines a category of the first fault record. In some embodiments, the power grid fault analysis system proceeds to the end of the process 400 without continuing to act 403 based on the determined category of the first fault record. For example, in some embodiments, the power grid fault analysis system may not proceed to act 403 if the category of the fault is not one of at least one fault category, such as, for example, a circuit trip. Thus, in such embodiments, the power grid fault analysis system is able to determine whether a fault requires an operator's attention based on the category of the first fault, and to determine whether analysis of the fault is required. Based on these determinations, the power grid fault analysis system is further able to conserve the resources of a computing device operating the power grid fault analysis system by obtaining predictions of the cause of a fault only when the fault category requires an operator's attention.

In some embodiments, the power grid fault cause analysis system clusters together relevant fault records from one disturbance. An operator may be able to set time intervals to display relevant events on a map, a list view, etc. In some embodiments, color codes are used to help an operator see an overall picture of the spread of the disturbance from trips to through faults to voltage dips to no fault. Color codes may also be used to identify records that show protection schemes that have not operated as expected. In some embodiments, the power grid fault cause analysis system generates a disturbance report containing relevant information about a disturbance or fault.

Figure 5:
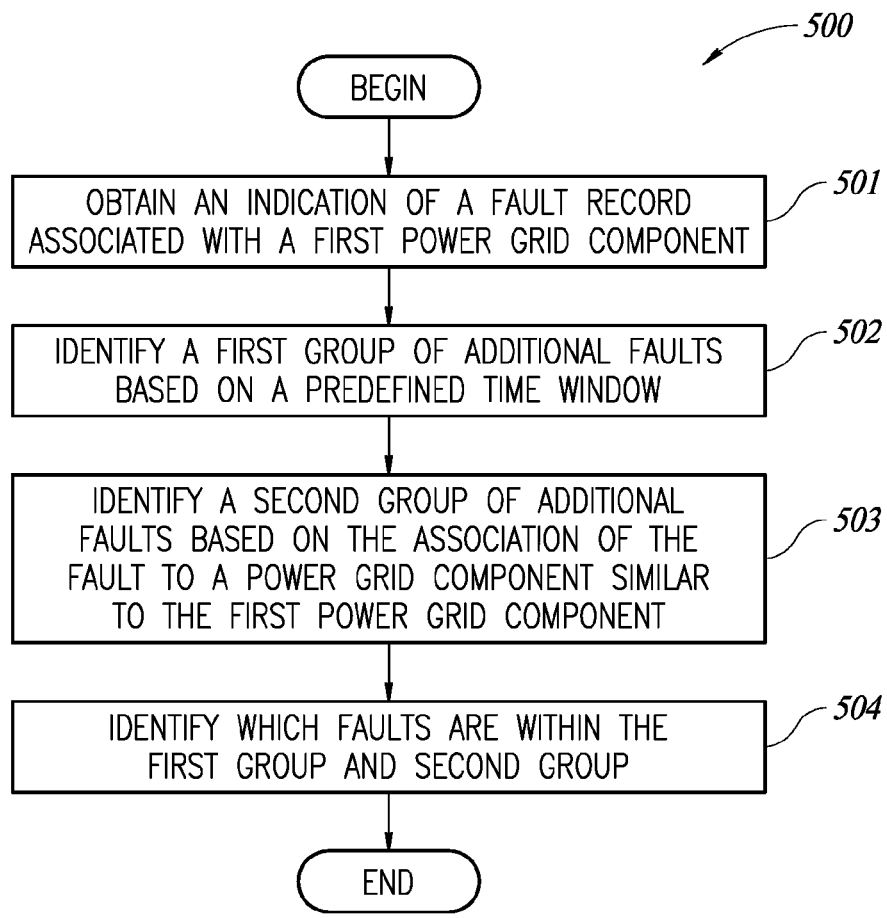
FIG. 5 is a flow diagram depicting a process used by a power grid fault analysis system to obtain additional fault records related to the first fault, according to various embodiments described herein.

FIG. 5 is a flow diagram depicting a process 500 used by a power grid fault analysis system to obtain additional fault records related to the first fault, according to various embodiments described herein. The process 500 begins, after a start block, at act 501, where the power grid fault analysis system obtains an indication of a first fault record associated with a first power grid component.

The process continues to act 502, where the power grid fault analysis system identifies a first group of additional faults based on a predefined time window. In some embodiments, the predefined time window is defined based on the category of the first fault record.

The process continues to act 503, where the power grid fault analysis system identifies a second group of additional faults based on the association of the fault to a power grid component similar to the first fault. In some embodiments, the power grid fault analysis system identifies the second group of additional faults based on a map of, the relative locations of, connections between, etc., electrical power grid components, such as the electrical power grid components 105. In some embodiments, at act 503, the power grid fault analysis system takes into account the first group of additional faults when determining the second group of additional faults.

For example, the power grid fault analysis system may identify a group of additional faults that occurred within the predetermined time period. The group of additional faults may include faults that occurred in electrical power grid components that are directly connected to, or adjacent to the first electrical power grid component, as well as faults which occurred in electrical power grid components that are not associated with or connected to the first electrical power grid component. The power grid fault analysis system may then determine whether the faults which occurred in electrical power grid components not associated with or connected to the first electrical power grid component should be included in the second group of additional faults.

The process continues to act 504, where the power grid fault analysis system identifies which faults are within both the first group of faults and the second group of faults. The power grid fault analysis system may identify the fault records associated with the additional group of fault records.

After act 504, the process 500 ends.

Figure 6:
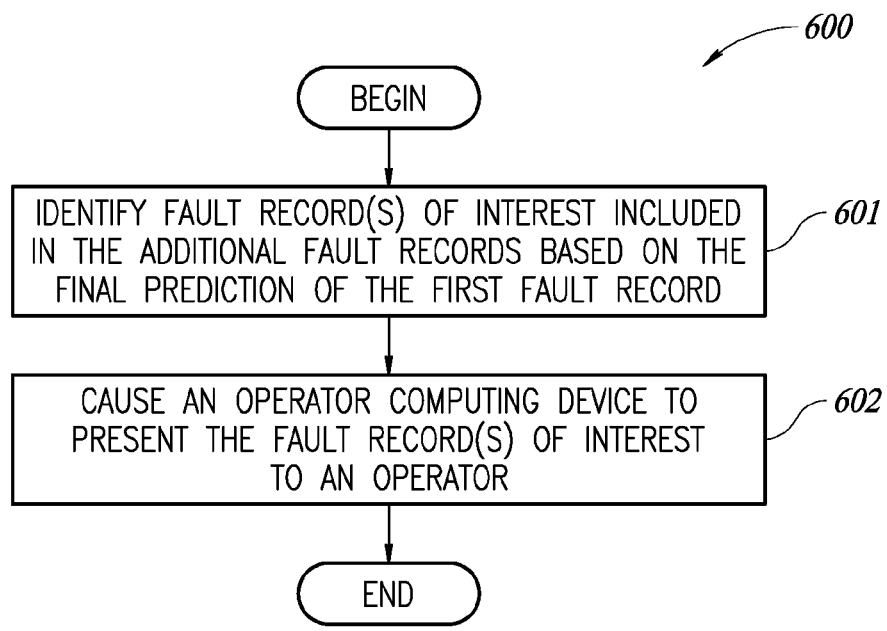
FIG. 6 is a flow diagram depicting a process used by a power grid fault analysis system to present fault records of interest to an operator, according to various embodiments described herein.

FIG. 6 is a flow diagram depicting a process 600 used by a power grid fault analysis system to present fault records of interest to an operator, according to various embodiments described herein. The process 600 begins, after a start block, at act 601, where the power grid fault analysis system identifies fault records of interest included in the additional fault records based on the final prediction of the first fault record. In some embodiments, the power grid fault analysis system identifies the fault records of interest by identifying one or more fault parameters from the fault record, such as the fault parameters described above with respect to FIG. 3c.

In some embodiments, identifying the fault records of interest includes comparing parameters of the additional fault records to one or more of: parameters of the primary fault record, to parameters of other additional fault records, to parameters of historic fault records, and other fault records. In some embodiments, identifying the fault records of interest includes using data indicating a representation of the electrical power grid and electrical power grid components, such as a map including the connections and power lines between electrical power grid components, as well as the electrical power grid components themselves.

The process 600 continues to act 602, where the power grid fault analysis system causes an operator computing device to present the fault records of interest to an operator. In some embodiments, the power grid fault analysis system causes the operator computing device to present the fault records of interest by transmitting an indication of the fault records of interest to the operator computing device.

After act 602, the process 600 ends.

Figure 7:
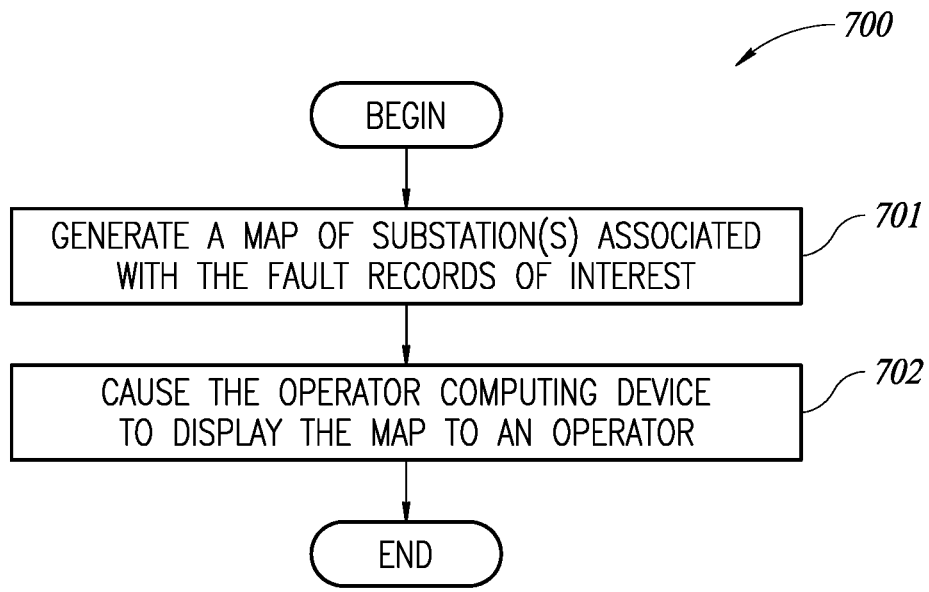
FIG. 7 is a flow diagram depicting a process used by a power grid fault analysis system to present a map of substations associated with the fault records of interest, according to various embodiments described herein.

FIG. 7 is a flow diagram depicting a process 700 used by a power grid fault analysis system to present a map of substations associated with the fault records of interest, according to various embodiments described herein. The process 700 begins, after a start block, at act 701, where the power grid fault analysis system generates a map of substations associated with the fault records of interest. In some embodiments, the power grid fault analysis system generates the map of substations based on information included in the fault records of interest, such as information indicating which electrical power grid component is associated with a respective fault record. In some embodiments, the map of substations includes other electrical power grid components, such as any of the electrical power grid components 105.

After act 701, the process 700 proceeds to act 702, where the power grid fault analysis system causes the operator computing device to display the map to an operator. In some embodiments, the power grid fault analysis system causes the operator computing device to display the map by causing the generated map to be transmitted to the operator computing device.

After act 702, the process 700 ends.

Figure 8:
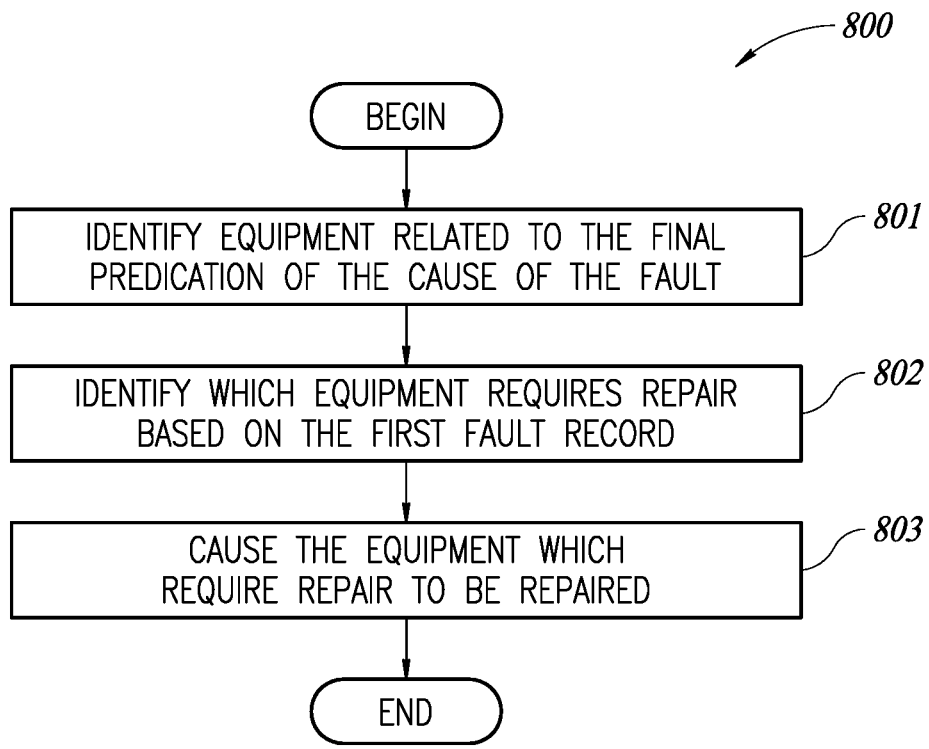
FIG. 8 is a flow diagram depicting a process used by a power grid fault analysis system to identify incipient conditions in equipment, according to various embodiments described herein.

FIG. 8 is a flow diagram depicting a process 800 used by a power grid fault analysis system to identify incipient conditions in equipment, according to various embodiments described herein. The process 800 begins, after a start block, at act 801, where the power grid fault analysis system identifies equipment related to the final prediction of the cause of the fault. In some embodiments, the equipment is identified based on one or more of: a category of the first fault, at least one fault record associated with the first fault, at least one fault parameters associated with the first fault, at least one electrical power grid component associated with the first fault, and information indicating the relative location or relationship between electrical power grid components, such as a map of electrical power grid components.

After act 801, the process 800 continues to act 802, where the power grid fault analysis system identifies which equipment requires repair based on the first fault record. In some embodiments, the power grid fault analysis system identifies whether the equipment requires repair based on at least one or more of: data included in the first fault record, fault parameters calculated based on data included in the first fault record, and data describing the equipment.

After act 802, the process 800 continues to act 803, where the power grid fault analysis system causes the equipment which requires repair to be repaired. In some embodiments, the power grid fault analysis system causes the equipment to be repaired by at least one or more of: notifying an operator that the equipment should be repaired, causing a maintenance to be scheduled for the equipment, or other methods of causing equipment to be repaired.

After act 803, the process 800 ends. In some embodiments, at act 802, instead of determining whether the equipment requires repair, the power grid fault analysis system determines whether the equipment may require repair in the future based on at least one or more of: data included in the first fault record, fault parameters calculated based on data included in the first fault record, and data describing the equipment.

In some embodiments, the process 800 is performed by the power grid fault analysis system even when a fault which is not associated with a circuit trip occurs, thereby allowing the power grid fault analysis system to identify equipment which may need repair before the failure of that equipment causes another fault or power grid disturbance.

Figure 9:
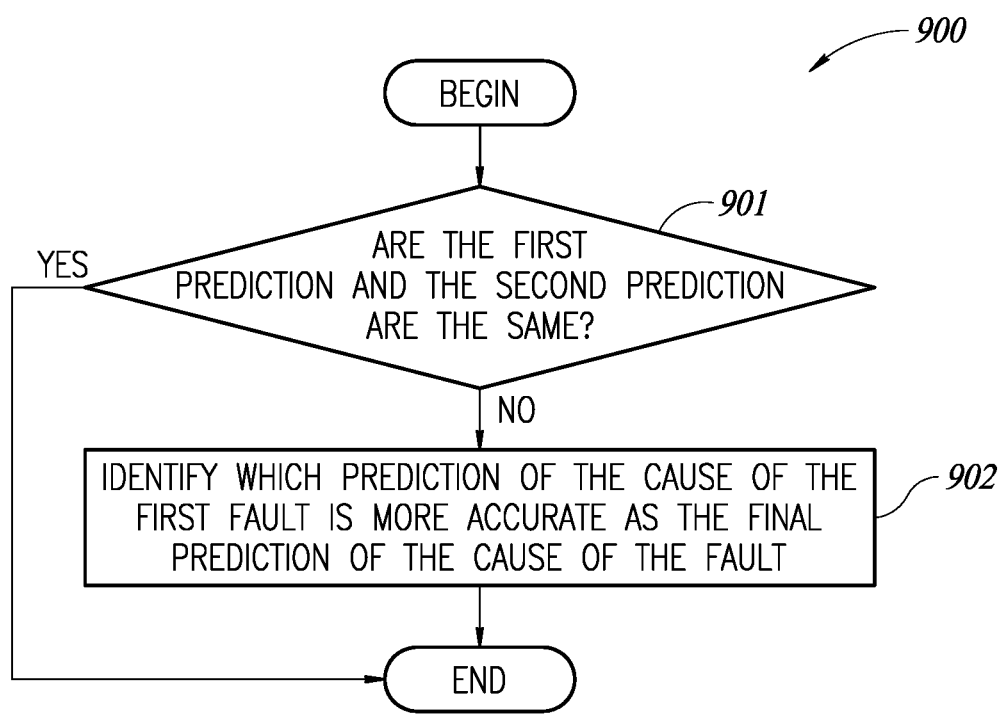
FIG. 9 is a flow diagram depicting a process to generate a final prediction of the cause of a fault, according to various embodiments described herein.

FIG. 9 is a flow diagram depicting a process 900 to generate a final prediction of the cause of a fault, according to various embodiments described herein. The process 900 begins, after a start block, at act 901, where the power grid fault analysis system determines whether a first prediction of the cause of the fault is the same as a second prediction of the cause of the fault. In some embodiments, the first prediction is obtained from a machine learning model trained to predict the cause of a fault based on one or more fault records. In some embodiments, the second prediction is obtained from a rules-based algorithm configured to predict the cause of a fault based on one or more fault records. If the power grid fault analysis system determines that the first and second predictions of the cause of the fault are the same, the process 900 ends, and the power grid fault analysis system determines that the cause of the fault indicated by the first prediction and second prediction is the final prediction of the cause of the fault.

If the power grid fault analysis system determines that the first prediction of the cause of the fault and the second prediction of the cause of the fault are not the same, the process 900 continues to act 902. At act 902, the power grid fault analysis system identifies which prediction of the cause of the first fault is more accurate as the final prediction of the cause of the fault. In some embodiments, when performing act 902, the power grid fault analysis system uses one or more processes similar to those described below with respect to FIGS. 10 and 11.

After act 902, the process ends.

Figure 10:
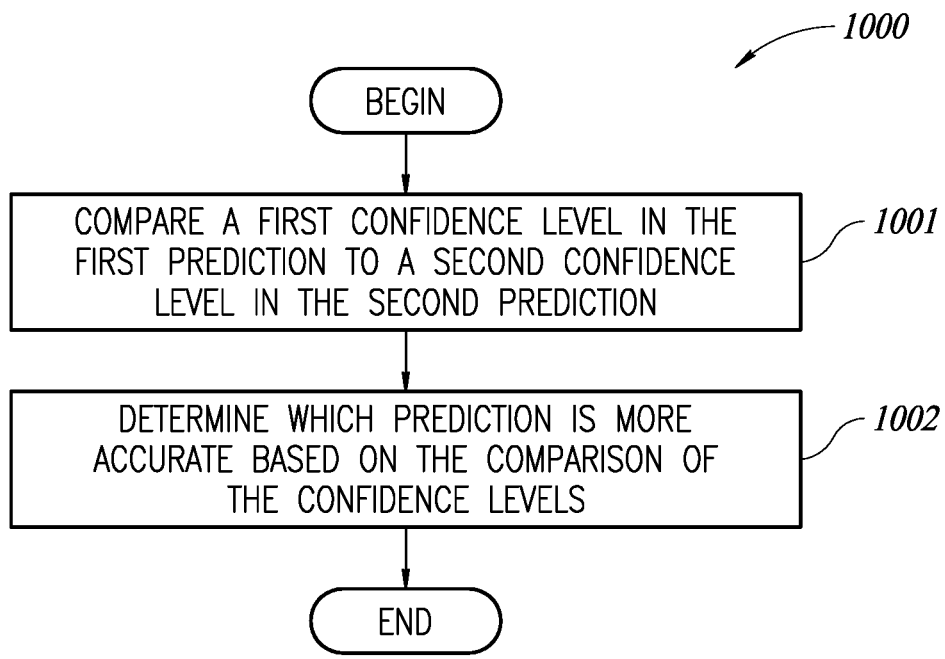
FIG. 10 is a flow diagram depicting a process used to identify which prediction of the cause of a fault is more accurate, according to various embodiments described herein.

FIG. 10 is a flow diagram depicting a process 1000 used to identify which prediction of the cause of a fault is more accurate, according to various embodiments described herein. The process 1000 begins, after a start block, at act 1001, where the power grid fault analysis system compares a first confidence level in the first prediction to a second confidence level in the second prediction. In some embodiments, the first confidence level is obtained as output from a machine learning model which generated the first prediction. In some embodiments, the second confidence level is obtained as output from a rules-based algorithm which generated the second prediction.

After act 1001, the process 1000 proceeds to act 1002, where the power grid fault analysis system determines which prediction is more accurate based on the comparison of the confidence levels. In some embodiments, at act 1002, a prediction is determined as more accurate than another prediction if the confidence level associated with the prediction is higher, greater than, etc., the confidence level associated with the other prediction.

After act 1002, the process 1000 ends. In some embodiments, the confidence level is obtained for one of the predictions, and the prediction is identified as the more accurate prediction if the confidence level exceeds a predetermined threshold.

Figure 11:
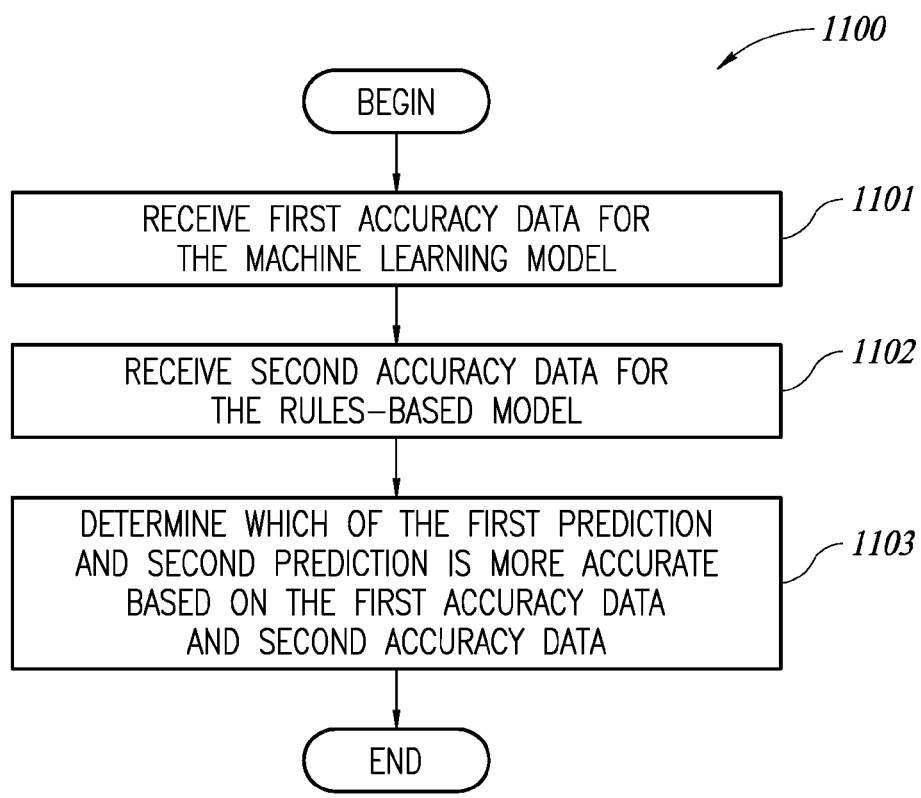
FIG. 11 is a flow diagram depicting a process used to identify which prediction of the cause of a fault is more accurate, according to various embodiments described herein.

FIG. 11 is a flow diagram depicting a process 1100 used to identify which prediction of the cause of a fault is more accurate, according to various embodiments described herein. The process 1100 begins, after a start block, at act 1101, where the power grid fault analysis system receives first accuracy data for a machine learning model which generated a first prediction of the cause of the fault. In some embodiments, the first accuracy data is determined based on historical accuracy data which describes the accuracy of the machine learning model in predicting the cause of a fault. The historical accuracy data may be supplemented by new accuracy data obtained by comparing the predicted cause of a fault generated by the machine learning model to an actual cause of the fault.

After act 1101, the process 1100 proceeds to act 1102, where the power grid fault analysis system receives second accuracy data for the rules-based model. In some embodiments, the second accuracy data is determined based on historical accuracy data which describes the accuracy of the rules-based model in predicting the cause of a fault. The historical accuracy data may be supplemented by new accuracy data obtained by comparing the predicted cause a fault generated by rules-based model to an actual cause of the fault.

After act 1102, the process 1100 proceeds to act 1103. At act 1103, the power grid fault analysis system determines which of the first prediction and the second prediction are more accurate based on the first accuracy data and the second accuracy data. In some embodiments, the first accuracy data and the second accuracy data include an indication of each respective model's accuracy in predicting the cause of faults which have certain fault categories. The power grid fault analysis system may determine which of the first and second prediction are more accurate based on the accuracy data and a category of the fault. For example, the machine learning model may be more accurate in predicting the cause of a fault which is categorized as a circuit trip, where the rules-based model may be more accurate in predicting the cause of a fault which is categorized as a failed trip. Likewise, in some embodiments, the accuracy data may include other information, such as the accuracy of a model in predicting the cause of faults with certain parameters, the accuracy of a model in predicting the cause of faults which have a threshold number of secondary faults, etc.

After act 1103, the process 1100 ends.

Figure 12:
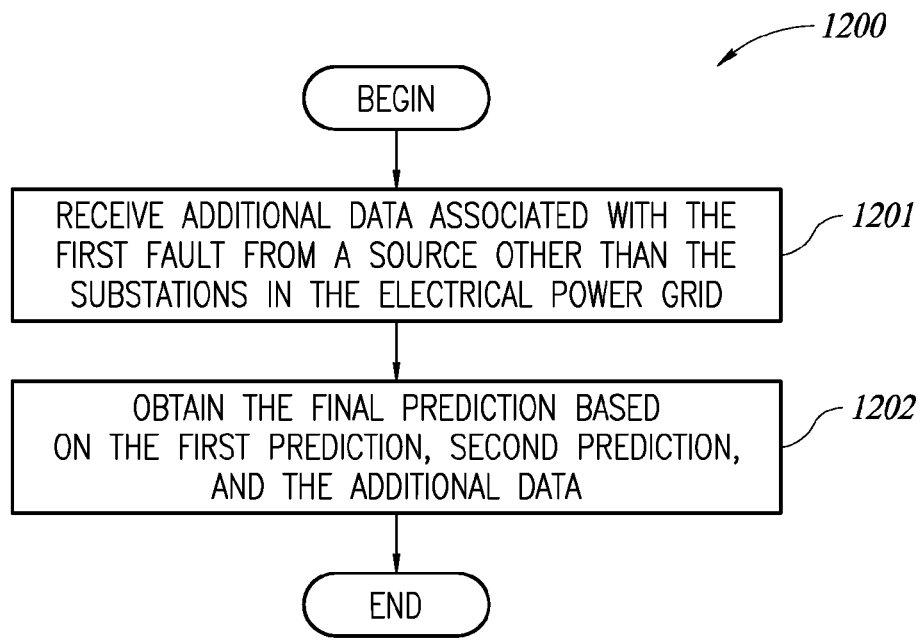
FIG. 12 is a flow diagram depicting a process used to obtain a final prediction based on additional data, according to various embodiments described herein.

FIG. 12 is a flow diagram depicting a process 1200 used to obtain a final prediction based on additional data, according to various embodiments described herein. The process 1200 begins, after a start block, at act 1201, where the power grid fault analysis system receives additional data associated with a first fault from a source other than the substations or electrical power grid components used in the electrical power grid. In some embodiments, the additional data includes one or more of: weather data, data describing equipment used in or by electrical power grid components, current power grid usage data, historical power grid usage data, predicted power grid usage data, data describing wildlife patterns in a region associated with the power grid, data describing plant-life patterns in a region associated with the power grid, or other data useful in determining the cause of a fault. In some embodiments, the source includes one or more of: a source of weather data, a source of population data, a source of current power grid usage data, a source of historical power usage data, a source of predicted power usage data, source of equipment data for equipment used in or by electrical power grid components, a source of wildlife data, a source of plant-life data, or other data sources related to the data used by the power grid fault analysis system to determine a cause of a fault.

After act 1201, the process 1200 proceeds to act 1202. At act 1202, the power grid fault analysis system obtains the final prediction of the cause of the fault based on the first prediction, the second prediction, and the additional data. In some embodiments, as part of performing act 1202, the power grid fault analysis system combines the first prediction and second prediction, such as by performing one or more of the processes described with respect to FIGS. 9, 10, and 11. In some embodiments, the power grid fault analysis system alters the combined prediction of the cause of the fault based on the additional data. In some embodiments, the additional data is used to determine whether a certain cause of the fault is more likely than other causes of the fault, and to apply this determination to a prediction of the cause of the fault.

After act 1202, the process 1200 ends.

Figure 13:
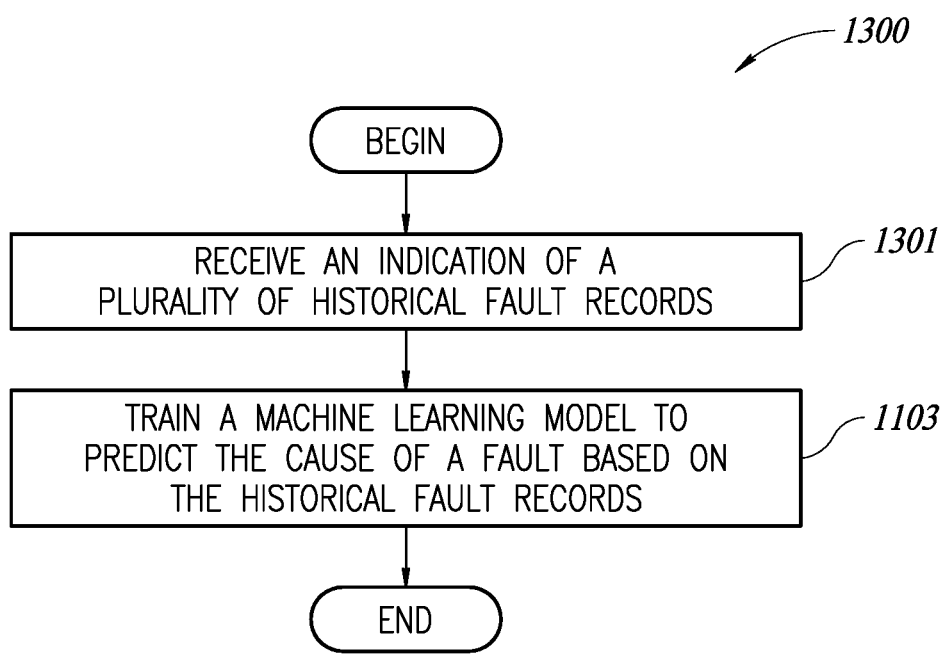
FIG. 13 is a flow diagram depicting a process to train an AI or machine learning model to predict the cause of a fault based on historical fault records, according to various embodiments described herein.

FIG. 13 is a flow diagram depicting a process 1300 to train an AI or machine learning model to predict the cause of a fault based on historical fault records, according to various embodiments described herein. The process 1300 begins, after a start block, at act 1301, where the power grid fault analysis system receives an indication of a plurality of historical fault records. In some embodiments, each fault record included in the plurality of historical fault records includes one or more of: one or more categories of a fault, one or more causes of the fault, and one or more fault parameters. In some embodiments, the power grid fault analysis system receives at least a portion of the historical fault records from one or more computing systems associated with one or more power grids. In some embodiments, the power grid fault analysis system receives at least a portion of the historical fault records from a repository of historical fault records.

After act 1301, the process 1300 continues to act 1302. At act 1302, the power grid fault analysis system trains an AI or machine learning model to predict the cause of fault based on the historical fault records.

After act 1302, the process ends.

Figure 14:
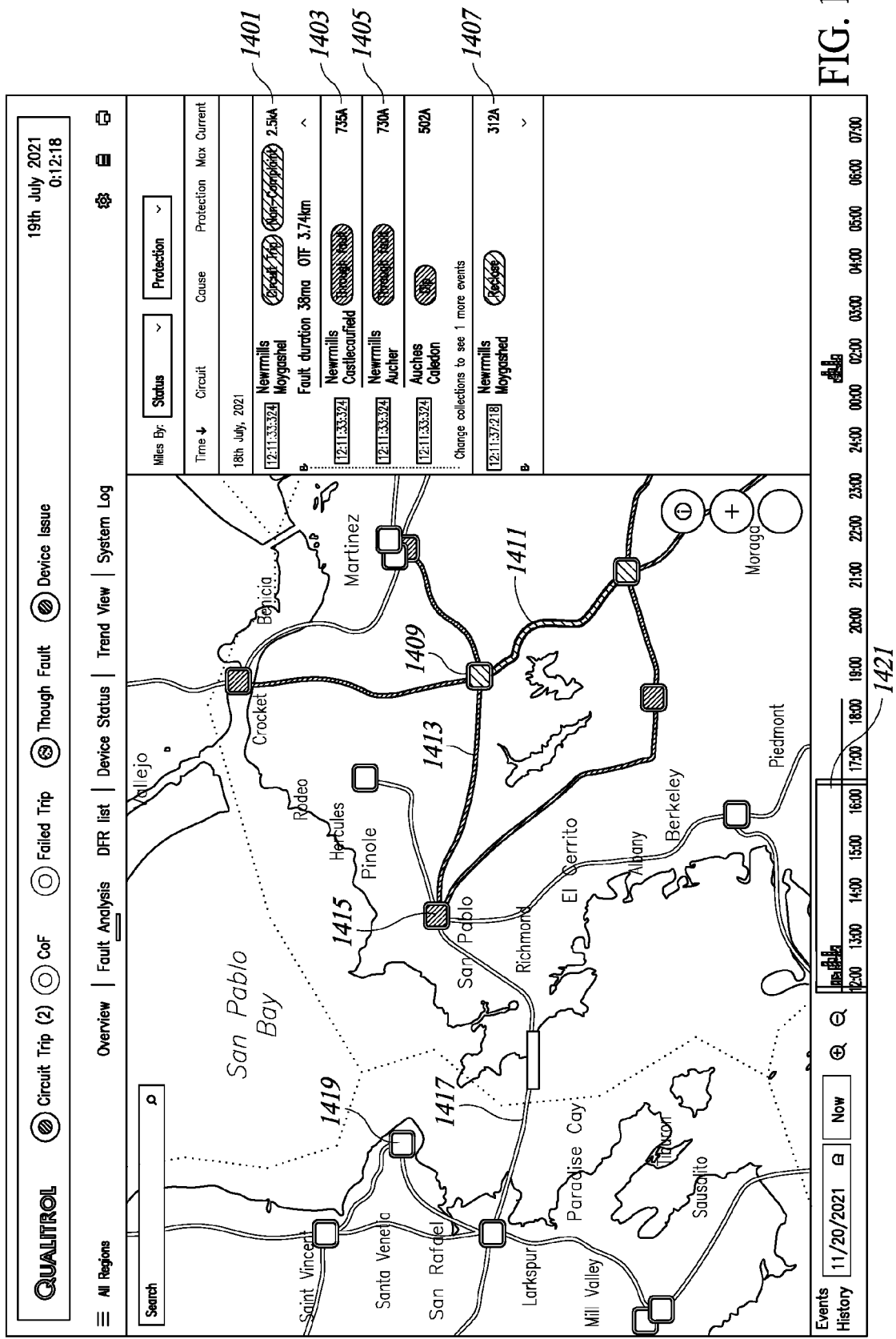
FIG. 14 is a sample map diagram of a map generated by a power grid fault analysis system, according to various embodiments described herein.

FIG. 14 is a sample map diagram of a map 1400 generated by a power grid fault analysis system, according to various embodiments described herein. The map 1400 includes primary fault indicators 1401 and 1407, secondary fault indicators 1403 and 1405, substation indicators 1409, 1415, and 1419, power line indicators 1411, 1413, and 1417, and a fault history slider 1421. The map 1400 may be generated by the power grid fault analysis system and caused to be presented to an operator via an operator computing device.

The primary fault indicators 1401 and 1407 each indicate that a primary fault has occurred during a time period denoted by the fault history slider 1421. The primary fault indicators each include a category of the fault, a cause of the fault, and parameters related to the fault. The primary fault indicators may also include an indication of a location of the fault. Additionally, a fault indicator, such as a primary fault indicator may be associated with a substation indicator. For example, the primary fault indicator 1401 indicates that a circuit trip occurred at the Newmills substation. Likewise, because a primary fault has occurred at the Newmills substation, the substation indicator 1409 is colored to indicate that the primary fault has occurred at that location.

The primary fault indicators may additionally include secondary fault indicators, such as the secondary fault indicators 1403 and 1405 which are included with the primary fault indicator 1401. The secondary fault indicators represent secondary faults which have occurred as a result of the primary fault. Thus, in the map 1400, the secondary faults indicated by secondary fault indicators 1403 and 1405 were determined, by the power grid fault analysis system, to be caused by the primary fault indicated by primary fault indicator 1401.

In determining whether the secondary faults were caused by a certain primary fault, the power grid fault analysis system may use the map 1400 to determine if the secondary faults have a connection to the primary fault, such as through a power line. As can be seen in the map 1400, substation 1419 is not directly connected to the substation 1415 via a power line. The nearest power line connection to substation 1415 is power line 1417. Thus, the power grid fault analysis system may determine that even though a fault of some kind may have occurred in the substation 1419, it cannot be related to the fault at substation 1409 because there is no trail of faults that lead to substation 1419 from substation 1409.

In an example embodiment, the map 1400 color codes electrical power grid components, such as: flashing red indicating a non-compliant disturbance, red indicating a trip, orange indicating a through fault, yellow indicating a voltage dip, and blue indicating other disturbances or faults. In another example embodiment, the map 1400 is accompanied by a list view of fault records where various events are color coded based on event importance, compliance to thresholds, etc.

In another example embodiment, an operator may interact with the fault record in a viewer to graphically show the analogue and digital inputs on a time/magnitude axis. In this example, the operator may be able to view a waveform of the fault in a horizontal or vertical direction, make measurements of amplitude and time, etc.

In another example embodiment, the power gird fault cause analysis system is able to use pattern matching to differentiate between various root causes, such as tree strikes versus lightning strikes versus crane touch versus cracked insulators, etc.

The various embodiments described above can be combined to provide further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A system for use in an electrical power grid, the system comprising:
   at least one processor; and at least one memory communicatively coupled to the at least one processor, the at least one memory having computer-executable instructions stored thereon that, when executed by the at least one processor, cause the system to:

electronically receive an indication that a first fault has occurred in the electrical power grid, the indication including a first fault record associated with the first fault, the first fault record being generated by a first substation of a plurality of substations;

electronically identify a plurality of additional fault records associated with the first fault, each respective fault record in the plurality of additional fault records being generated by a respective substation in the electrical power grid other than the first substation;

electronically obtain a first prediction of a cause of the first fault by applying the first fault record and the plurality of additional fault records to a trained machine learning model that has been trained to predict the cause of a fault based on historical fault records;

electronically obtain a second prediction of the cause of the first fault by applying the first fault record to a rules-based model;

electronically obtain a final prediction of the cause of the first fault based on the first prediction and the second prediction; and based on the final prediction of the cause of the first fault, electronically cause the predicted cause of the first fault to be remedied.

2. The system of claim 1, wherein to electronically cause the predicted cause of the first fault to be remedied, the computer-executable instructions further cause the system to:

electronically identify one or more fault records of interest included in the plurality of additional fault records based on the final prediction and the first fault record; and electronically cause an operator computing device to present the one or more fault records of interest to an operator.

3. The system of claim 2, wherein to electronically cause the operator computing device to present the one or more fault records of interest, the computer-executable instructions further cause the system to:

electronically generate a map of one or more substations associated with the one or more fault records of interest; and electronically cause the operator computing device to display the map to the operator.

4. The system of claim 1, wherein to electronically cause the predicted cause of the first fault to be remedied, the computer-executable instructions further cause the system to:

electronically identify one or more pieces of equipment in a substation associated with the first fault which are related to the final prediction of the cause of the first fault;

electronically identify which piece or pieces of equipment of the one or more pieces of equipment require repair based on at least the first fault record; and electronically cause the pieces of equipment which require repair to be repaired.

5. The system of claim 1, wherein the rules-based model is a first rules-based model, and wherein to electronically identify the plurality of additional fault records, the computer-executable instructions further cause the system to:

for each respective fault record of the plurality of additional fault records:

electronically identify a category of the fault associated with the respective fault record by applying the respective fault record to a second rules-based model which is configured to identify a category for a fault based on a fault record.

6. The system of claim 1, wherein to electronically obtain the final prediction of the cause of the first fault based on the first prediction of the cause of the first fault and the second prediction of the cause of the first fault, the computer-executable instructions further cause the system to:

electronically determine whether the first prediction of the cause of the first fault and the second prediction of the cause of the first fault are the same;

based on a determination that the first prediction of the cause of the first fault and the second prediction of the cause of the first fault are not the same, electronically determine which prediction of the cause of the first fault is more accurate; and based on the determination of which prediction of the cause of the first fault is more accurate, electronically identify the prediction of the cause of the first fault which is more accurate as the final prediction of the cause of the first fault.

7. The system of claim 6, wherein to electronically determine which prediction of the cause of the first fault is more accurate, the computer-executable instructions further cause the system to:

electronically compare a first confidence level included in the first prediction of the cause of the first fault to a second confidence level included in the second prediction of the cause of the first fault; and electronically determine which prediction of the cause of the first fault is more accurate based on the comparison of the first confidence level and the second confidence level.

8. The system of claim 6, wherein to electronically determine which prediction of the cause of the first fault is more accurate, the computer-executable instructions further cause the system to:

electronically receive first accuracy data indicating an accuracy of the machine learning model in predicting the cause of a fault for faults which are classified in the same category of fault as the first fault;

electronically receive second accuracy data indicating an accuracy of the rules-based model in predicting the cause of a fault for faults which are classified in the same category of fault as the first fault; and electronically determine which prediction of the cause of the fault is more accurate based on the first accuracy data and the second accuracy data.

9. The system of claim 1, wherein to electronically obtain the final prediction of the cause of the first fault, the computer-executable instructions further cause the system to:

electronically receive an indication of additional data associated with the first fault from a source other than the substations included in the electrical power grid; and electronically obtain the final prediction of the cause of the first fault based on the first prediction, the second prediction, and the additional data associated with the first fault.

10. The system of claim 9, wherein the additional data associated with the first fault includes one or more of:

weather data, equipment data for one or more pieces of equipment used by the electrical power grid, and power usage statistics for a population which receives power from the electrical power grid.

11. The system of claim 1, wherein the computer-executable instructions further cause the system to:

electronically receive an indication of a plurality of historical fault records in an electrical power grid including a plurality of substations, each historical fault record including:
a category of a fault; and
a cause of the fault; and
electronically train the machine learning model to predict the cause of a fault based on the plurality of historical fault records.

12. A method for use in an electrical power grid, the method comprising:
receiving an indication that a first fault has occurred in the electrical power grid, the indication including a first fault record associated with the first fault, the first fault record being generated by a first substation of a plurality of substations;
identifying a plurality of additional fault records associated with the first fault, each respective fault record in the plurality of additional fault records being generated by a respective substation in the electrical power grid other than the first substation;
obtaining a first prediction of a cause of the first fault by applying the first fault record and the plurality of additional fault records to a trained machine learning model that has been trained to predict the cause of a fault based on historical fault records;
obtaining a second prediction of the cause of the first fault by applying the first fault record to a rules-based model;
obtaining a final prediction of the cause of the first fault based on the first prediction and the second prediction; and
based on the final prediction of the cause of the first fault, causing the predicted cause of the fault to be remedied.

13. The method of claim 12, wherein causing the predicted cause of the first fault to be remedied further comprises:
identifying one or more fault records of interest included in the plurality of additional fault records based on the final prediction and the first fault records; and
causing an operator computing device to present the one or more fault records of interest to an operator.

14. The method of claim 13, wherein causing the operator computing device to present the one or more fault records of interest comprises:
generating a map of one or more substations associated with the one or more fault records of interest; and
causing the operator computing device to display the map to the operator.

15. The method of claim 12, wherein causing the predicted cause of the first fault to be remedied comprises:
identifying one or more pieces of equipment in a substation associated with the first fault which are related to the final prediction of the cause of the first fault;
identifying which piece or pieces of equipment of the one or more pieces of equipment require repair based on at least the first fault record; and
causing the pieces of equipment which require repair to be repaired.

16. The method of claim 12, wherein the rules-based model is a first rules-based model, and wherein identifying the plurality of additional fault records comprises:
for each respective fault record of the plurality of additional fault records:
identifying a category of the fault associated with the respective fault record by applying the respective fault record to a second rules-based model which is configured to identify a category for a fault based on a fault record.

17. A nontransitory processor-readable storage medium that stores instructions, the instructions, when executed by at least one processor, cause the at least one processor to:
receive an indication that a first fault has occurred in a electrical power grid, the indication including a first fault record associated with the first fault, the first fault record being generated by a first substation of a plurality of substations;
identify a plurality of additional fault records associated with the first fault, each respective fault record in the plurality of additional fault records being generated by a respective substation in the electrical power grid other than the first substation;
obtain a first prediction of a cause of the first fault by applying the first fault record and the plurality of additional fault records to a machine learning model that has been trained to predict the cause of a fault based on historical fault records;
obtain a second prediction of the cause of the first fault by applying the first fault record to a rules-based model;
obtain a final prediction of the cause of the first fault based on the first prediction and the second prediction; and
based on the final prediction of the cause of the first fault, cause the predicted cause of the first fault to be remedied.

18. The nontransitory processor-readable storage medium of claim 17, wherein the rules-based model is a first rules-based model, and wherein to identify the plurality of additional fault records, the at least one processor is further caused to:
for each respective fault record of the plurality of additional fault records:
identify a category of the fault associated with the respective fault record by applying the respective fault record to a second rules-based model which is configured to identify a category for a fault based on a fault record.

19. The nontransitory processor-readable storage medium of claim 17, wherein to obtain the final predictions of the first fault, the at least one processor is further caused to:
determine whether the first prediction of the cause of the first fault and the second prediction of the cause of the first fault are the same; and
based on a determination that the first prediction of the cause of the first fault and the second prediction of the cause of the first fault are not the same, determine which prediction of the cause of the first fault is more accurate; and
based on the determination of which prediction of the cause of the first fault is more accurate, identify the prediction of the cause of the first fault which is more accurate as the final prediction of the cause of the first fault.

20. The nontransitory processor-readable storage medium of claim 19, wherein to determine which prediction of the cause of the first fault is more accurate, the at least one processor is further caused to:
receive first accuracy data indicating an accuracy of the machine learning model in predicting the cause of a fault for faults which ware classified in the same category of fault as the first fault;
receive second accuracy data indicating an accuracy of the rules-based model in predicting the cause of a fault for faults which are classified in the same category of fault as the first fault; and
determine which prediction of the cause of the fault is more accurate based on the first accuracy data and the second accuracy data.

21. The nontransitory processor-readable storage medium of claim 19, wherein to determine which prediction of the cause of the first fault is more accurate the at least one processor is further caused to:

compare a first confidence level included in the first prediction of the cause of the first fault to a second confidence level included in the second prediction of the cause of the first fault; and determine which prediction of the cause of the first fault is more accurate based on the comparison of the first confidence level and the second confidence level.

\* \* \* \* \*